United States Patent
Hwang et al.

(10) Patent No.: US 6,552,516 B2
(45) Date of Patent: Apr. 22, 2003

(54) REGULATOR SYSTEM FOR CONTROLLING OUTPUT VOLTAGE AND METHOD OF CONTROLLING THE SAME

(75) Inventors: Byung-Hun Hwang, Kyonggi-do (KR); Dong-In Ha, Seoul (KR); Ho-Soo Seo, Kyonggi-do (KR); Hyung-Suk Kim, Kyonggi-do (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/183,842

(22) Filed: Jun. 27, 2002

(65) Prior Publication Data

US 2003/0030418 A1 Feb. 13, 2003

(30) Foreign Application Priority Data

Aug. 9, 2001 (KR) ......................... 2001-48062

(51) Int. Cl.$^7$ .............. G05F 1/40; G05F 1/44; G05F 1/56
(52) U.S. Cl. .............. 323/274; 323/273; 323/284; 323/285
(58) Field of Search ................... 323/273, 274, 323/275, 282, 284, 285

(56) References Cited

U.S. PATENT DOCUMENTS 5,656,926 A * 8/1997 Ragsdale .............. 323/282
5,672,988 A * 9/1997 Nelson et al. .............. 327/108
5,705,919 A * 1/1998 Wilcox .............. 323/268
5,729,426 A * 3/1998 Ragsdale .............. 361/328
5,815,015 A * 9/1998 Nelson et al. .............. 327/113
5,831,418 A * 11/1998 Kitagawa .............. 323/222
6,031,362 A * 2/2000 Bradley .............. 323/267
6,087,816 A * 7/2000 Volk .............. 323/222

* cited by examiner

Primary Examiner—Bao Vu
(74) Attorney, Agent, or Firm—Dilworth & Barrese, LLP

(57) ABSTRACT

A regulator system and method for controlling the level of an output voltage. The regulator system comprises a regulator, enabled in response to an enable signal, for converting a level of an input signal into a predetermined value and providing a first output signal, a smoother for smoothing the first output signal from the regulator and providing the smoothed signal as a second output signal, and an enable signal generator for generating an initial version of the enable signal to control an enable period of the regulator so that the second output signal has a target level and adjusting an enable active period of the initial version of the enable signal to generate a new version of the enable signal when a level of the second output signal associated with the initial version of the enable signal is different from the target level.

8 Claims, 4 Drawing Sheets

REGULATOR SYSTEM FOR CONTROLLING OUTPUT VOLTAGE AND METHOD OF CONTROLLING THE SAME

PRIORITY

This application claims priority to an application entitled "REGULATOR SYSTEM FOR CONTROLLING OUTPUT VOLTAGE AND METHOD OF CONTROLLING THE SAME", filed in the Korean Industrial Property Office on Aug. 9, 2001 and assigned Serial No. 2001-48062, the contents of which are hereby incorporated by reference.

BACKGROUND OF THE INVENTION

1. Field of the Invention

The present invention relates generally to a regulator system, and more particularly to a regulator system and method for controlling an enable period of an input signal to control an output voltage.

2. Description of the Related Art

Generally, a regulator, for example, a low drop output (LDO)-type regulator, is adapted to convert the level of an input signal into a predetermined value and output the resulting signal. A general structure and output voltage of such a regulator will hereinafter be described with reference to FIGS. 1 and 2, respectively.

FIG. 1 illustrates the structure of a general regulator. As illustrated in FIG. 1, the regulator has four terminals, an input terminal INPUT for receiving an input signal, an enable terminal ENABLE for receiving an enable signal to drive the regulator, an output terminal OUTPUT for providing an output signal based on the input signal in response to an enabled state of the regulator, and a ground terminal GND. Upon receiving the enable signal, the regulator converts the level of the input signal received through the input terminal into a predetermined value and provides the resulting output signal through the output terminal. The relationship between the input signal to the regulator and the output signal from the regulator will hereinafter be described with reference to FIG. 2.

FIG. 2 is a timing diagram illustrating an input/output signal relationship of the regulator of FIG. 1. In FIG. 2, the reference character (a) denotes the enable signal and (b) denotes the output signal. If the enable signal (a) is turned on, then the signal (b) is outputted after a predetermined time delay. If the enable signal (a) is turned off, then the output of the signal (b) is stopped similarly after the predetermined time delay. Namely, the enable signal (a) acts to turn on or off the output of the regulator, or the output signal (b). The period in which the enable signal (a) remains ON will hereinafter be referred to as an "enable active period". When the regulator is a high active device, it is enabled to output the signal (b) when the enable signal (a) is high, and it is disabled to stop the output of the signal (b) when the enable signal (a) is low. On the contrary, when the regulator is a low active device, it is enabled to output the signal (b) when the enable signal (a) is low, and it is disabled to stop the output of the signal (b) when the enable signal (a) is high. Here, the output signal (b) has a voltage level as indicated by $V_{out}$.

However, the above-mentioned regulator has a disadvantage in that the voltage level $V_{out}$ of the output signal (b) cannot be changed because it is preset in a manufacturing process of the regulator, thereby making it impossible for the regulator to output a signal of a different voltage level as may be desired by a system.

SUMMARY OF THE INVENTION

Therefore, the present invention has been made in view of the above problem, and it is an object of the present invention to provide a regulator system and method for controlling an enable period of a regulator to control the level of an output signal.

In accordance with one aspect of the present invention, the above and other objects can be accomplished by utilizing a regulator system for controlling an output voltage, comprising a regulator, enabled in response to an enable signal, for converting a level of an input signal into a predetermined value and providing the resulting first output signal; a smoother for smoothing the first output signal from the regulator and providing the smoothed signal as a second output signal; and an enable signal generator for generating an initial version of the enable signal to control an enable period of the regulator in such a way that the second output signal has a target level and adjusting an enable active period of the initial version of the enable signal to generate a new version of the enable signal when a level of the second output signal associated with the initial version of the enable signal is different from the target level.

In accordance with another aspect of the present invention, there is provided a method for controlling a regulator system controlling an output voltage, the regulator system including a regulator, enabled in response to an enable signal, for converting a level of an input signal into a predetermined value and providing the resulting first output signal, and a smoother for smoothing the first output signal from the regulator and providing the smoothed signal as a second output signal, the method comprising the steps of: a) generating an initial version of the enable signal to control an enable period of the regulator in such a way that the second output signal has a target level; b) checking a feedback level of the second output signal associated with the initial version of the enable signal; and c), if the feedback level of the second output signal associated with the initial version of the enable signal is different from the target level, adjusting an enable active period of the initial version of the enable signal to generate a new version of the enable signal.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
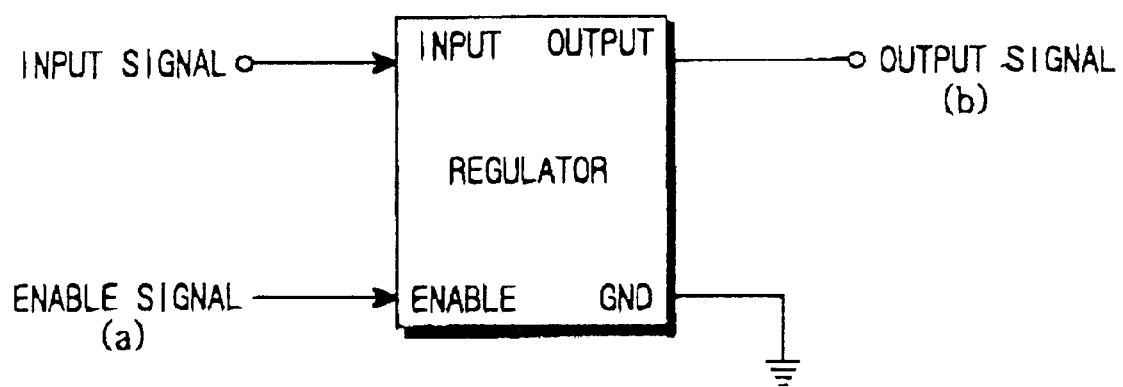
FIG. 1 illustrates the structure of a general regulator.
Figure 2:
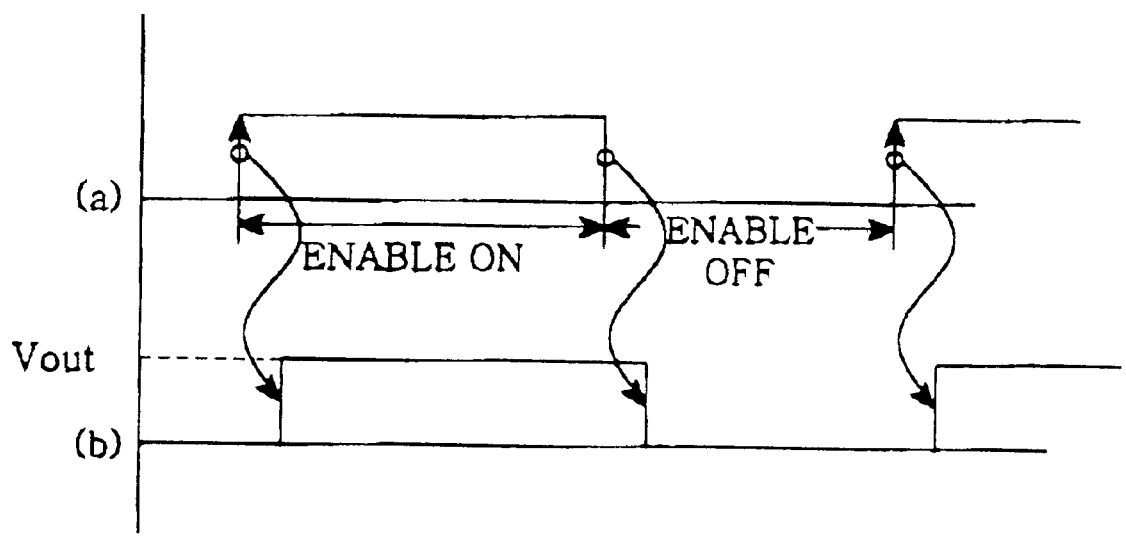
FIG. 2 is a timing diagram illustrating an input/output signal relationship of the regulator of FIG. 1.

Preferred embodiments of the present invention will be described in detail herein below with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear. Also, the terms used in the following description are terms defined taking into consideration the functions obtained in accordance with the present invention. The definitions of these terms should be determined based on the whole content of this specification because they may be changed in accordance with the option of a user or chip designer or a usual practice.

Figure 3:
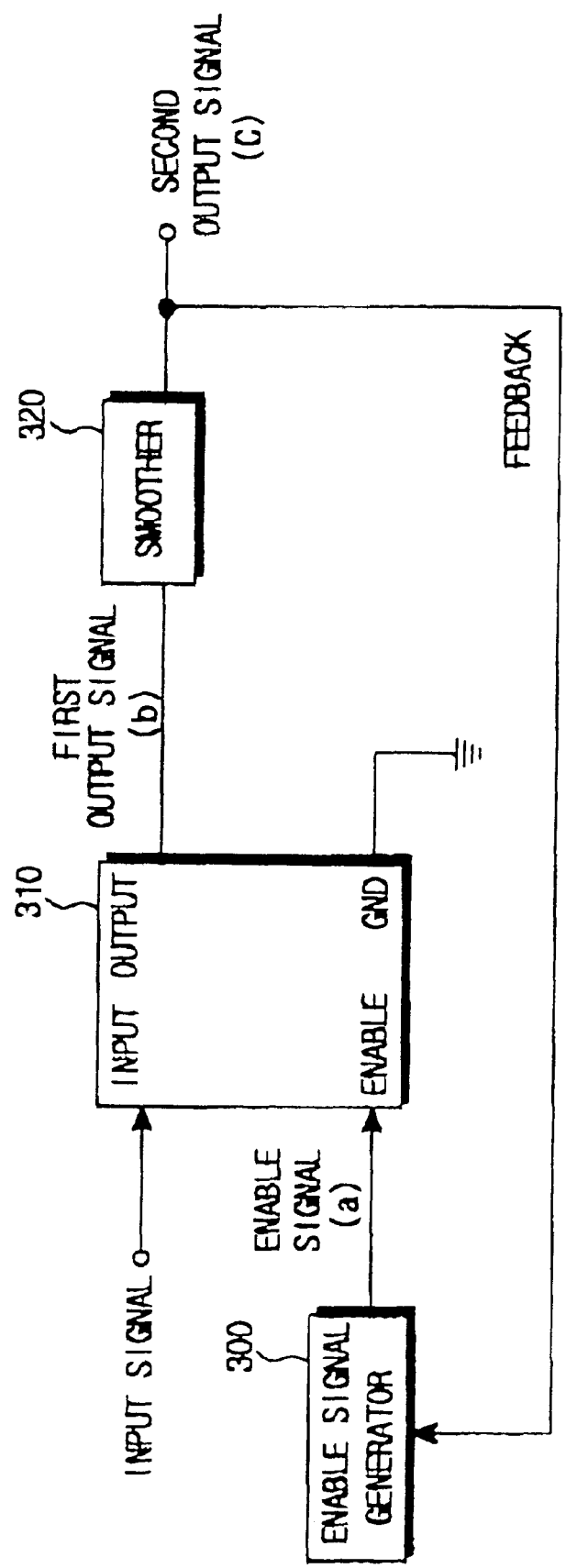
FIG. 3 is a block diagram illustrating the internal construction of a regulator system for controlling the level of an output signal in accordance with a preferred embodiment of the present invention.

FIG. 3 is a block diagram illustrating the internal construction of a regulator system for controlling the level of an output signal in accordance with a preferred embodiment of the present invention. As shown in FIG. 3, the regulator system comprises an enable signal generator 300, regulator 310 and smoother 320. With this construction, the regulator system controls the level of an output signal from the regulator. The enable signal generator 300 may be implemented with, for example, a programmable pulse width modulation generator. The enable signal generator 300 adjusts a duty cycle of an enable signal (a) according to the level of a signal to be outputted from the regulator system and generates the resulting enable signal. The level of the signal to be outputted from the regulator system will hereinafter be referred to as a "target level", and the duty cycle is a ratio of ON time to OFF time of the enable signal (a). From this point, it can be seen that the higher the duty cycle of the enable signal (a), the longer the ON period of the enable signal (a), whereas the lower the duty cycle of the enable signal (a), the shorter the ON period of the enable signal (a).

The operation of the regulator system with the above-mentioned construction, in accordance with the preferred embodiment of the present invention, will now be described implementing the enable signal generator 300 with a programmable pulse width modulation generator as an example.

The enable signal generator 300 generates the enable signal (a) in a pulse width modulated format, which is then applied to an enable terminal of the regulator 310. The regulator 310 provides its output signal with a level that is determined depending on the duty cycle of the enable signal (a) from the enable signal generator 300. Namely, in the same time interval, the higher the duty cycle of the enable signal (a), the higher the level of a first output signal (b) from the regulator 310. Conversely, the lower the duty cycle of the enable signal (a), the lower the level of the first output signal (b) from the regulator 310. Such level variations in the first output signal (b) with the enable active period of the enable signal (b) will be described in detail later with reference to FIG. 4.

The regulator 310 has four terminals, an input terminal INPUT for receiving an input signal, an enable terminal ENABLE for receiving the enable signal (a) to drive the regulator 310, an output terminal OUTPUT for providing the first output signal (b) based on the input signal in response to an enabled state of the regulator 310, and a ground terminal GND. Upon receiving the enable signal (a), the regulator 310 converts the level of the input signal received through the input terminal into a predetermined value and provides the resulting first output signal (b) through the output terminal.

The first output signal (b) from the output terminal of the regulator 310 is sent to the smoother 320, which then smoothes the first output signal (b) and provides the smoothed signal as a second output signal (c). The output signal from the smoother 320, or the second output signal (c), is fed back to the enable signal generator 300. Upon receiving the second output signal (c) from the smoother 320, which has a direct current (DC) voltage level, the enable signal generator 300 compares the level of the second output signal (c) with the target output signal level desired by the regulator system, to determine whether the actual output signal level is equal to the target level. If it is determined that the actual output signal level, or the level of the second output signal (c), is not equal to the target level, the enable signal generator 300 adjusts the duty cycle of the enable signal (a) such that the actual output signal level becomes equal to the target level. For example, in the case where the level of the second output signal (c) is higher than the target level desired by the regulator system, the enable signal generator 300 makes the duty cycle of the enable signal a lower than the previous value to lower the level of the second output signal (c). On the contrary, when the level of the second output signal (c) is lower than the target level, the enable signal generator 300 makes the duty cycle of the enable signal (a) higher than the previous value to raise the level of the second output signal (c).

Figure 4:
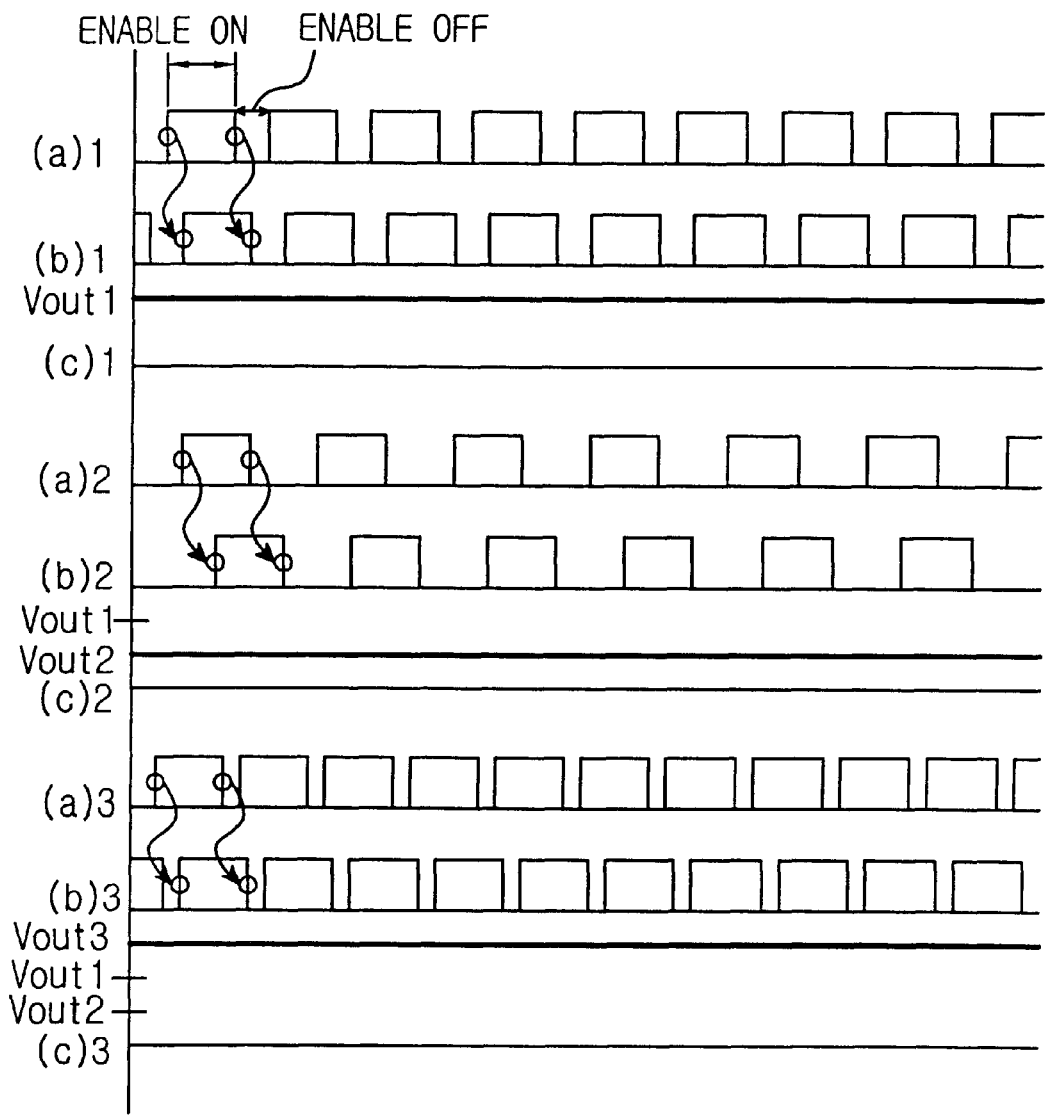
FIG. 4 is a timing diagram illustrating relationships among signals in the regulator system of FIG. 3.

The relationships among the enable signal (a), the first output signal (b) and the second output signal (c) will hereinafter be described with reference to FIG. 4, a timing diagram illustrating relationships among the signals in the regulator system of FIG. 3.

A description of an operation of the regulator system associated with an enable signal (a)1 shown in FIG. 4 will be described herein below. It should be noted here that the enable signal (a), first output signal (b), and second output signal (c) are denoted by different reference numerals in FIG. 4 according to different duty cycles of the enable signal (a). In other words, in the case where the enable signal (a) has a first duty cycle, it is represented as the enable signal (a)1, the first output signal (b) associated with the enable signal (a)1 is represented as a first output signal (b)1, and the second output signal (c) associated with the first output signal (b)1 is represented as a second output signal (c)1. Also, when the enable signal (a) has a second duty cycle, it is represented as an enable signal (a)2, the first output signal (b) associated with the enable signal (a)2 is represented as a first output signal (b)2, and the second output signal (c) associated with the first output signal (b)2 is represented as a second output signal (c)2. Further, when the enable signal (a) has a third duty cycle, it is represented as an enable signal (a)3, the first output signal (b) associated with the enable signal (a)3 is represented as a first output signal (b)3, and, the second output signal (c) associated with the first output signal (b)3 is represented as a second output signal (c)3.

Firstly, when the enable signal (a) has the first duty cycle, the regulator system is operated using of the enable signal (a)1 in the following manner. If the enable signal generator 300 outputs the enable signal (a)1 as illustrated in FIG. 4, then the regulator 310 converts the level of the input signal into a predetermined value in response to the enable signal (a)1 and provides the resulting first output signal (b)1 to the smoother 320. The smoother 320 smoothes the first output signal (b)1 and provides the resulting second output signal (c)1. When the enable signal (a)1 is generated, the second output signal (c)1 has a voltage level $V_{out}$.

Secondly, when the enable signal (a) has the second duty cycle, the regulator system is operated using the enable signal (a)2 in the following manner (In the present embodiment, the second duty cycle is set to be lower than the first duty cycle). If the enable signal generator 300 outputs the enable signal (a)2 as illustrated in FIG. 4, then the regulator 310 converts the level of the input signal into a predetermined value in response to the enable signal (a)2 and provides the resulting first output signal (b)2, which is then applied to the smoother 320. The smoother 320 smoothes the first output signal (b)2 and provides the resulting second output signal (c)2. When the enable signal (a)2 is generated, the second output signal (c)2 has a voltage level $V_{out2}$. Because the second duty cycle is lower than the first duty cycle, a period of time for which the regulator 310 remains enabled is shortened in the same time interval, thereby causing the level of the second output signal (c)2 to be lower than that of the second output signal (c)1 ($V_{out1} > V_{out2}$).

Thirdly, when the enable signal (a) has the third duty cycle, the regulator system is operated on the basis of the enable signal (a)3 in the following manner (In the present embodiment, the third duty cycle is set to be higher than the first duty cycle). If the enable signal generator 300 outputs the enable signal (a)3 as illustrated in FIG. 4, then the regulator 310 converts the level of the input signal into a predetermined value in response to the enable signal (a)3 and provides the resulting first output signal (b)3, which is then applied to the smoother 320. The smoother 320 smoothes the first output signal (b)3 and provides the resulting second output signal (c)3. When the enable signal (a)3 is generated, the second output signal (c)3 has a voltage level $V_{out3}$. Because the third duty cycle is higher than the first duty cycle, a period of time for which the regulator 310 remains enabled is lengthened in the same time interval, thereby causing the level of the second output signal (c)3 to be higher than that of the second output signal (c)1 ($V_{out1} < V_{out3}$).

As apparent from the above description, the present invention provides a regulator system and method for controlling an enable period of a regulator with a fixed output signal level to control the level of an output signal. The output signal level of the regulator is controlled to have a desired value with no need for replacing the regulator with a different one. Therefore, the present invention has the effect of increasing efficiency of resources and convenience to a user.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A regulator system for controlling an output voltage, comprising:

a regulator, enabled in response to an enable signal, for converting a level of an input signal into a predetermined value and providing a first output signal;

a smoother for smoothing said first output signal from said regulator and providing the smoothed signal as a second output signal; and an enable signal generator for generating an initial version of said enable signal to control an enable period of said regulator so that said second output signal has a target level and adjusting an enable active period of said initial version of said enable signal to generate a new version of said enable signal when a level of said second output signal associated with said initial version of said enable signal is different from said target level.

2. The regulator system as set forth in claim 1, wherein said enable signal is a pulse width modulated signal.

3. The regulator system as set forth in claim 2, wherein said enable signal generator is adapted to generate said new version of said enable signal so that said new version of said enable signal has a duty cycle higher than that of said initial version of said enable signal when the level of said second output signal associated with said initial version of said enable signal is lower than said target level.

4. The regulator system as set forth in claim 2, wherein said enable signal generator is adapted to generate said new version of said enable signal so that said new version of said enable signal has a duty cycle lower than that of said initial version of said enable signal when the level of said second output signal associated with said initial version of said enable signal is higher than said target level.

5. A method for controlling a regulator system for controlling an output voltage, said regulator system including a regulator, enabled in response to an enable signal, for converting a level of an input signal into a predetermined value and providing a first output signal, and a smoother for smoothing said first output signal from said regulator and providing the smoothed signal as a second output signal, said method comprising the steps of:

a) generating an initial version of said enable signal to control an enable period of said regulator so that said second output signal has a target level;

b) checking a feedback level of said second output signal associated with said initial version of said enable signal; and c) adjusting an enable active period of said initial version of said enable signal to generate a new version of said enable signal if said feedback level of said second output signal associated with said initial version of said enable signal is different from said target level.

6. The method as set forth in claim 5, wherein said enable signal is a pulse width modulated signal.

7. The method as set forth in claim 6, wherein said step c) includes the step of generating said new version of said enable signal so that said new version of said enable signal has a duty cycle higher than that of said initial version of said enable signal when the level of said second output signal associated with said initial version of said enable signal is lower than said target level.

8. The method as set forth in claim 6, wherein said step c) includes the step of generating said new version of said enable signal so that said new version of said enable signal has a duty cycle lower than that of said initial version of said enable signal when the level of said second output signal associated with said initial version of said enable signal is higher than said target level.

* * * * *